(12) United States Patent
Wu et al.

(10) Patent No.: US 12,178,052 B2
(45) Date of Patent: Dec. 24, 2024

(54) MRAM CIRCUIT STRUCTURE AND LAYOUT STRUCTURE

(71) Applicant: UNITED MICROELECTRONICS CORP., Hsin-Chu (TW)

(72) Inventors: Yi-Ting Wu, Tainan (TW);
Cheng-Tung Huang, Kaohsiung (TW);
Jen-Yu Wang, Tainan (TW);
Yung-Ching Hsieh, Tainan (TW);
Po-Chun Yang, Tainan (TW);
Jian-Jhong Chen, Tainan (TW);
Bo-Chang Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 724 days.

(21) Appl. No.: 17/368,848

(22) Filed: Jul. 7, 2021

(65) Prior Publication Data
US 2022/0384523 A1    Dec. 1, 2022

(30) Foreign Application Priority Data

May 31, 2021    (CN) .......................... 202110598874.1

(51) Int. Cl.
*H10B 61/00*    (2023.01)
*H10N 50/80*    (2023.01)

(52) U.S. Cl.
CPC ............. *H10B 61/22* (2023.02); *H10N 50/80* (2023.02)

(58) Field of Classification Search
CPC .............................. H10N 50/80; H10B 61/22
USPC .......................................................... 257/427
See application file for complete search history.

(56) References Cited

U.S. PATENT DOCUMENTS

| | | | | |
|---|---|---|---|---|
| 8,634,232 B2* | 1/2014 | Oh | ........................... | G11C 8/08 |
| | | | | 365/158 |
| 11,139,027 B1* | 10/2021 | Islam | .................... | G11C 13/004 |
| 2010/0237321 A1* | 9/2010 | Inaba | ..................... | H10B 61/22 |
| | | | | 257/E27.098 |
| 2011/0069534 A1* | 3/2011 | Inaba | ...................... | G11C 11/16 |
| | | | | 365/158 |
| 2014/0339616 A1* | 11/2014 | Abe | ................... | G11C 14/0081 |
| | | | | 257/295 |
| 2020/0013455 A1* | 1/2020 | Tzoufras | ............. | G11C 11/1673 |
| 2020/0013456 A1* | 1/2020 | Tzoufras | ................ | H10N 50/80 |
| 2022/0180905 A1* | 6/2022 | Islam | ................... | G11C 13/004 |

* cited by examiner

*Primary Examiner* — Jami Valentine Miller
(74) *Attorney, Agent, or Firm* — Winston Hsu

(57) ABSTRACT

A MRAM circuit structure is provided in the present invention, with the unit cell composed of three transistors in series and four MTJs, wherein the junction between first transistor and third transistor is first node, the junction between second transistor and third transistor is second node, and the other ends of first transistor and third transistor are connected to a common source line. First MTJ is connected to second MTJ in series to form a first MTJ pair that connecting to the first node, and third MTJ is connected to fourth MTJ in series to form a second MTJ pair that connecting to the second node.

9 Claims, 7 Drawing Sheets

MRAM CIRCUIT STRUCTURE AND LAYOUT STRUCTURE

BACKGROUND OF THE INVENTION

1. Field of the Invention

The present invention relates generally to a circuit structure of magnetoresistive random access memory (MRAM) and relevant layout structures, and more specifically, to a circuit structure of spin transfer torque (STT) MRAM with each unit cell consisted of three transistors and four magnetic tunnel junction (MTJs) (3T4M-STT MRAM).

2. Description of the Prior Art

MRAM is a kind of non-volatile memory that has drawn a lot of attention in this technology field recently regarding its potentials of incorporating advantages of other kinds of memories. For example, an MRAM device may have an operation speed comparable to SRAMs, the non-volatile feature and low power consumption comparable to flash, the high integrity and durability comparable to DRAM. More important, the process for forming MRAM devices may be conveniently incorporated into current semiconductor manufacturing processes. Thus, it has the potential to become primary memory used in semiconductor chips. A typical MRAM cell structure usually comprises a memory stack structure comprising magnetic tunnel junction (MTJ) set between lower and upper interconnecting structures. Unlike conventional memories that data is stored by electric charge or current flow, an MRAM cell stores data by applying external magnetic fields to control the magnetic polarity and tunneling magnetoresistance (TMR) of the magnetic tunnel junction.

In MRAM, the mechanism of spin transfer torque (STT) MRAM is to flip the magnetization direction through the torque generated by the electron spin energy applied on the ferromagnetic atoms, thereby achieving the purpose of data storage. In comparison to common MRAM that uses magnetic field to flip charge carriers, the advantage of STT-MRAM is low power consumption and better scalability, with promising potential for development.

A part of current STT-MRAM adopts 1T2M or 2T2M dual-bits architecture, that is, each unit cell is provided with one transistor and two MTJs connected in series or provided with two transistors and two MTJs connected in series. These kinds of design are disadvantageous in slow reading speed and writing speed. Furthermore, as the electronic produce keep shrinking and scaling, how to accommodate more memory cells in a limited layout area becomes an essential topic for those skilled in the art to develop.

SUMMARY OF THE INVENTION

In the light of aforementioned disadvantage in prior art and inventive requirement nowadays, the present invention hereby provided a novel MRAM circuit structure and relevant layout structure, with features of adopting dual-bits 3T4M circuit architecture to substantially increase the reading speed and writing speed and to further reduce necessary layout areas.

One aspect of the present invention is to provide a MRAM circuit structure with multiple unit cells, wherein each unit cell includes three transistors of a first transistor, a third transistor and a second transistor connected sequentially in series, wherein a junction of the first transistor and the third transistor is first node, and a junction of the second transistor and the third transistor is second node, and the other ends of the first transistor and the second transistor are connected to a common source line, and four MTJs including a first MTJ, a second MTJ, a third MTJ and a fourth MTJ, wherein the first MTJ and the second MTJ are connected in series to form a first MTJ pair, and one end of the first MTJ pair is connected to the first node, and the third MTJ and the fourth MTJ are connected in series to form a second MTJ pair, and one end of the second MTJ pair is connected to the second node.

Another aspect of the present invention is to provide a MRAM layout structure with multiple unit cells, wherein each unit cell includes a substrate with multiple active areas formed thereon, a first word line, a second word line and a third word line respectively extending through the active areas, wherein the active area at outer side of the first word line is first active area, the active area between the first word line and the second word line is second active area, and the active area between the second word line and the third word line is third active area, and the active area at outer side of the third word line is fourth active area, and four MTJs including a first MTJ, a second MTJ, a third MTJ and a fourth MTJ, wherein two ends of the first MTJ are connected respectively to the second active area and one end of the second MTJ, and two ends of the third MTJ are connected respectively to the third active area and one end of the fourth MTJ, and a first bit line and a second bit line connected respectively to the other end of the second MTJ and the other end of the fourth MTJ.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
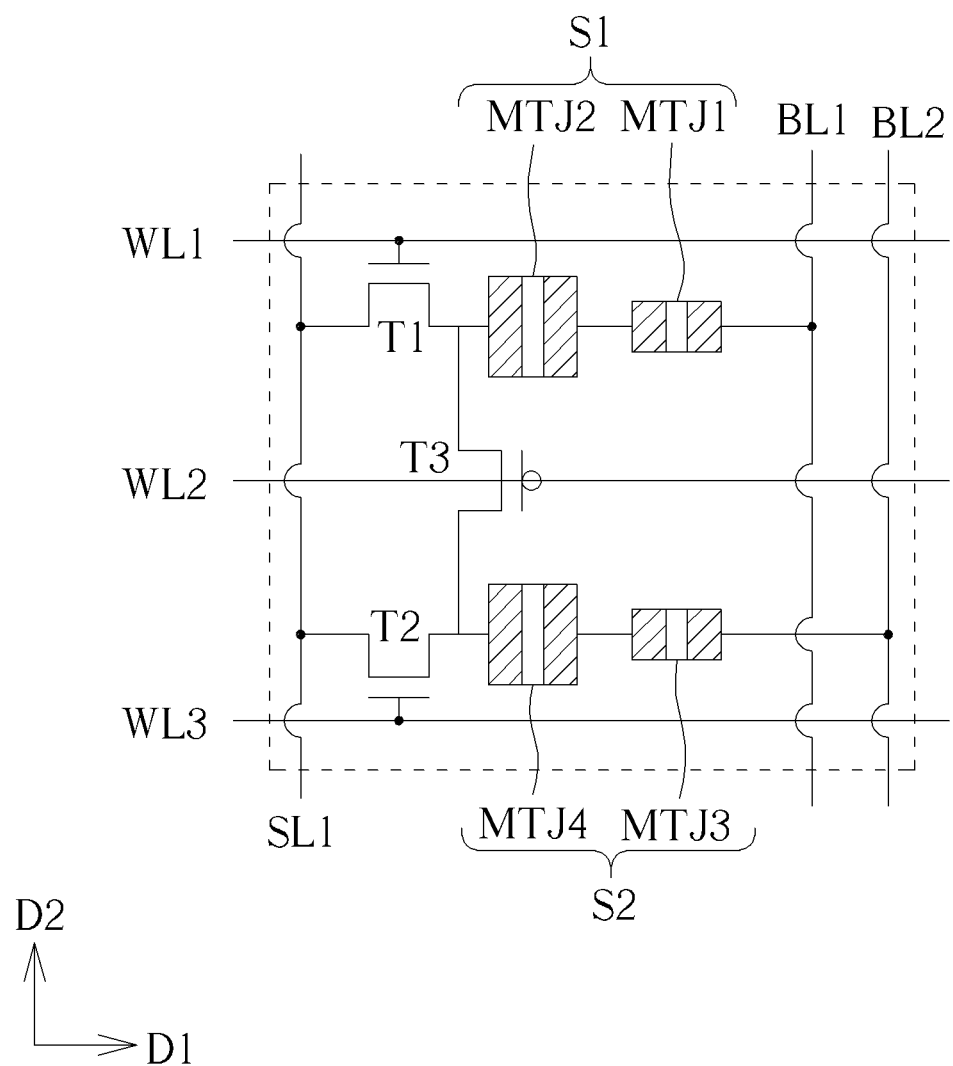
FIG. 1 is a circuit diagram of 3T4M STT-MRAM in accordance with the embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

In addition, spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

Firstly, please refer to FIG. 1, which is a circuit diagram of 3T4M STT-MRAM (spin transfer torque magnetoresistive random access memory) in accordance with the embodiment of present invention. One unit cell UC of the STT-MRAM is shown in the figure, including three transistors T1~T3, four magnetic tunnel junctions (MTJ) MTJ1~MTJ4, one source line SL1, two bit lines BL1, BL2 and three word lines WL1~WL3. The three transistors T1~T3 are respectively first transistor T1, third transistor T3 and second transistor T2 connected sequentially in series, wherein the junction of first transistor T1 and third transistor T3 is first node N1, and the junction of second transistor T2 and third transistor T3 is second node N2, and the other ends of the first transistor T1 and the second transistor T2 are connected to a common source line SL1.

Refer still to FIG. 1. The present invention adopts dual-bits architecture. As shown in the figure, the MTJ1 and the MTJ2 are connected in series to form a first MTJ pair S1, and the MTJ3 and the MTJ4 are connected in series to form a second MTJ pair S2, wherein MTJ1 and MTJ3 are smaller in size with greater resistance, while MTJ2 and MTJ4 are larger in size with lesser resistance. The size difference of the MTJs in a MTJ pair enables them to be read and written individually. One end of the first MTJ pair S1 is connected to the first node N1 (i.e. between the MTJ1 and the MTJ3), and the other end of the first MTJ pair S1 is connected to the first bit line BL1. One end of the second MTJ pair S2 is connected to the second node N2 (i.e. between the MTJ2 and the MTJ3), and the other end of the second MTJ pair S2 is connected to the second bit line BL2.

Refer still to FIG. 1. As shown in the figure, in the preferred embodiment of present invention, three word lines WL1~WL3 extend in a first direction D1 through the unit cell UC, wherein the first word line WL1 is connected with the gate of first transistor T1, the second word line WL2 is connected with the gate of third transistor T3, and the third word line WL3 is connected with the gate of second transistor T2, in order to control the switch of these transistors. The source line SL1 and the two bit lines BL1, BL2 extend in a second direction D2 perpendicular to the first direction D1 through the unit cell UC. In the embodiment of present invention, generally, the first transistor T1 and the first MTJ pair S1 may be considered as a first part, while the second transistor T2 and the second MTJ pair S2 may be considered as a second part. Two ends of the two parts are connected respectively with bit lines and source lines, and the conduction of these parts is controlled by word lines. The third transistor T3 bridges between the two parts to function as an optional current channel.

Figure 2:
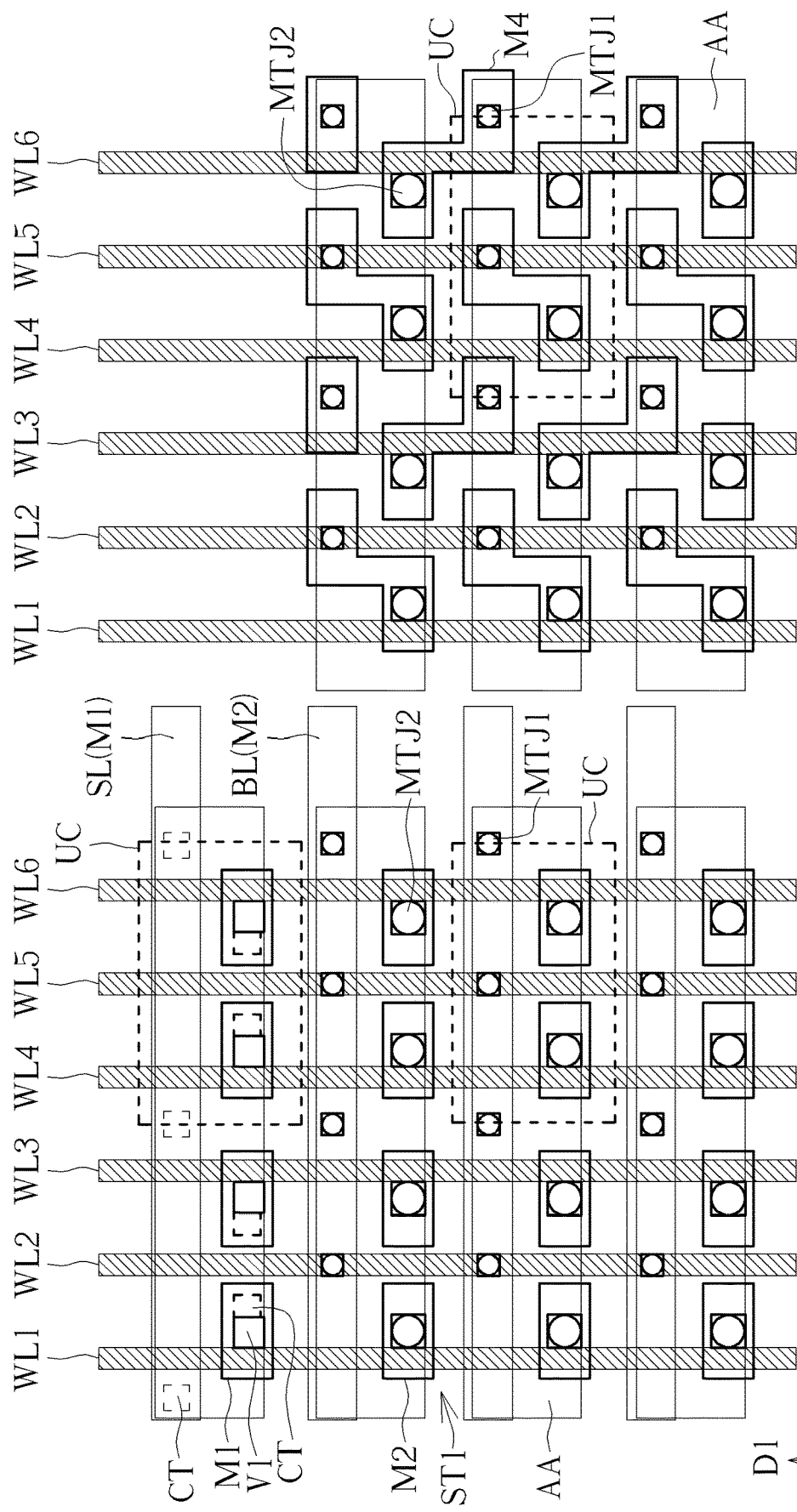
FIG. 2 is a layout of 3T4M STT-MRAM in accordance with the embodiment of present invention.
Figure 3:
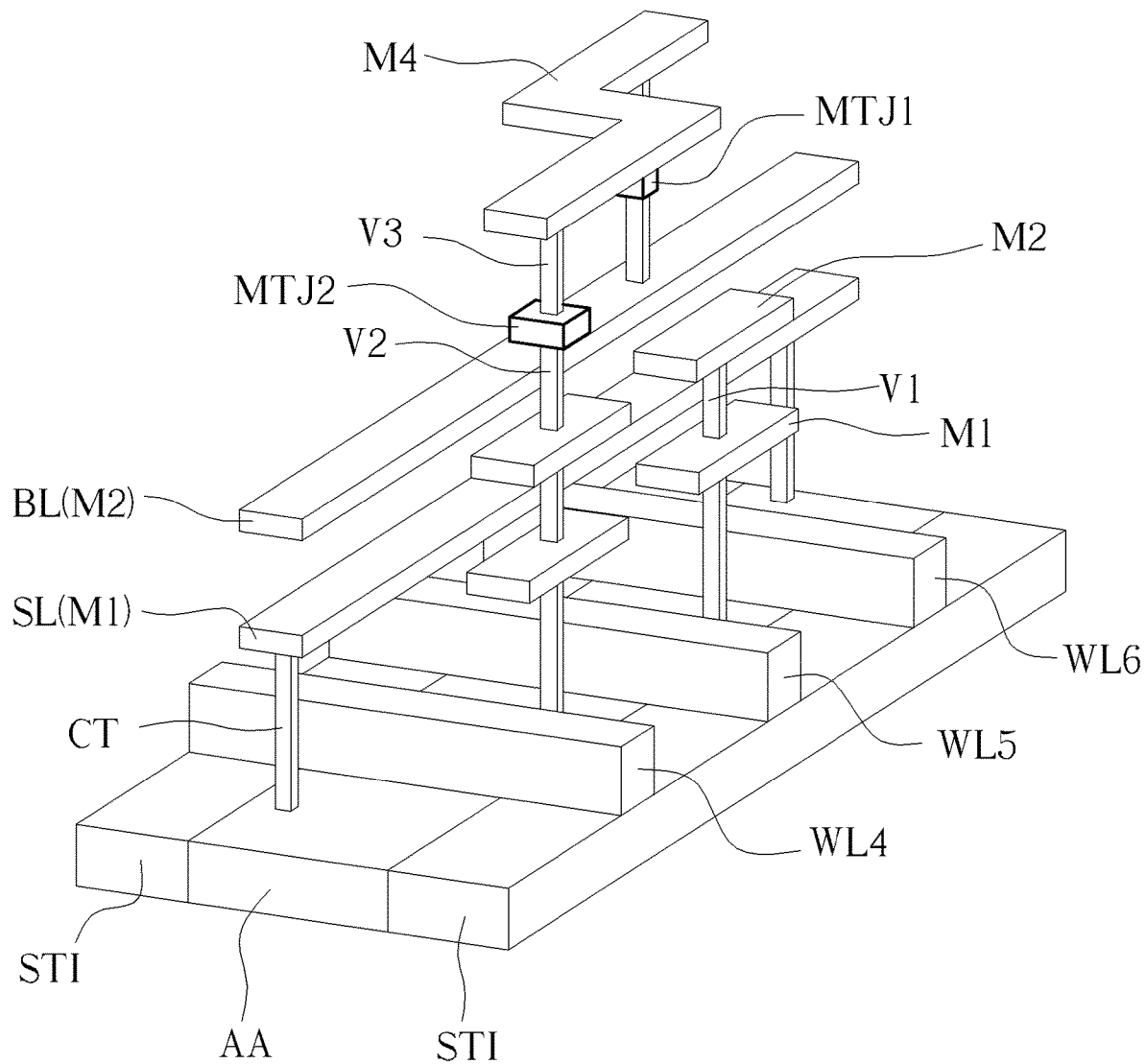
FIG. 3 is a 3D view of 3T4M STT-MRAM in accordance with the embodiment of present invention.

Next, please refer concurrently to FIG. 2 and FIG. 3, which are respectively a layout and a 3D view of 3T4M STT-MRAM in accordance with the preferred embodiment of present invention. Please note that multiple unit cells UC are shown in FIG. 2, and the level structure of fourth metal layer M4 is shown separately in the right half of FIG. 2 in order to provide a clear layout of the present invention. FIG. 3 substantially shows the layer structure including the components of an unit cell UC in the vertical direction.

As shown in figure, the STT-MRAM structure of present invention is formed on a substrate. The substrate may be a silicon substrate with wells like p-well formed therein in advance through doping process. Multiple conductive active areas AA are defined on the substrate, such as multiple active areas AA extending in the second direction D2 in FIG. 2, with silicon oxide based shallow trench isolations STI formed therebetween to provide electrical isolation. Multiple word lines, such as the WL1~WL6 shown in the figure, extend in the first direction D1 through multiple active areas AA to function as the gates of transistors and control the switch of the transistors. Sources and drains of the transistors may be formed in the active areas AA at two sides of the word lines WL1~WL6 through doping process. It can be seen in FIG. 3 that the word line WL4 and source/drain at two sides correspond exactly to the first transistor T1 in FIG. 1, and the word line WL5 and source/drain at two sides correspond exactly to the third transistor T3 in FIG. 1, and the word line WL6 and source/drain at two sides correspond exactly to the second transistor T2 in FIG. 1, wherein the sources/drains at two sides of the word lines WL4 and W16 may be connected respectively and upwardly to a first metal layer M1 and a common source line SL (may be in M1 level) through contacts. The sources/drains at two sides of the word line WL5 may be connected upwardly to the first metal layer M1 through a contact and be further connected to a larger MTJ, such as MTJ2, through a via V1.

Refer still to FIG. 2 and FIG. 3. The source lines SL and bit lines BL extend in the second direction D2 over the active areas AA, wherein each unit cell UC corresponds to one source SL and two bit lines BL, and the source line SL may be formed in the first metal layer M1 while the bit line BL may be formed in the second metal layer M2 and may partially or entirely overlap the source line SL. In the preferred embodiment of present invention, the MTJs are formed in the third metal layer M3. As shown in FIG. 3, source/drain at two sides of the word line WL5 (corresponding to the third transistor T3 in FIG. 1) are connected to the larger MTJ above (ex. MTJ2) through interconnects like contact CT, via V1 and via V2. The MTJ2 is further connected upwardly to the fourth metal layer M4 above through a via V3. As shown in the right half of FIG. 2, each MTJ would correspond to an overlying rectangular block of fourth metal layer M4 with equal area. With respect to the MTJs in the same dual-bits set, the overlying blocks of fourth metal layer M4 are connected with each other to form the MTJ pair. As shown in FIG. 3, the larger MTJ2 is connected with the smaller MTJ1 through the fourth metal layer M4 to form the first MTJ pair S1, and the first MTJ pair S1 is further connected to a bit line BL through the via V3 below the MTJ1.

Figure 4:
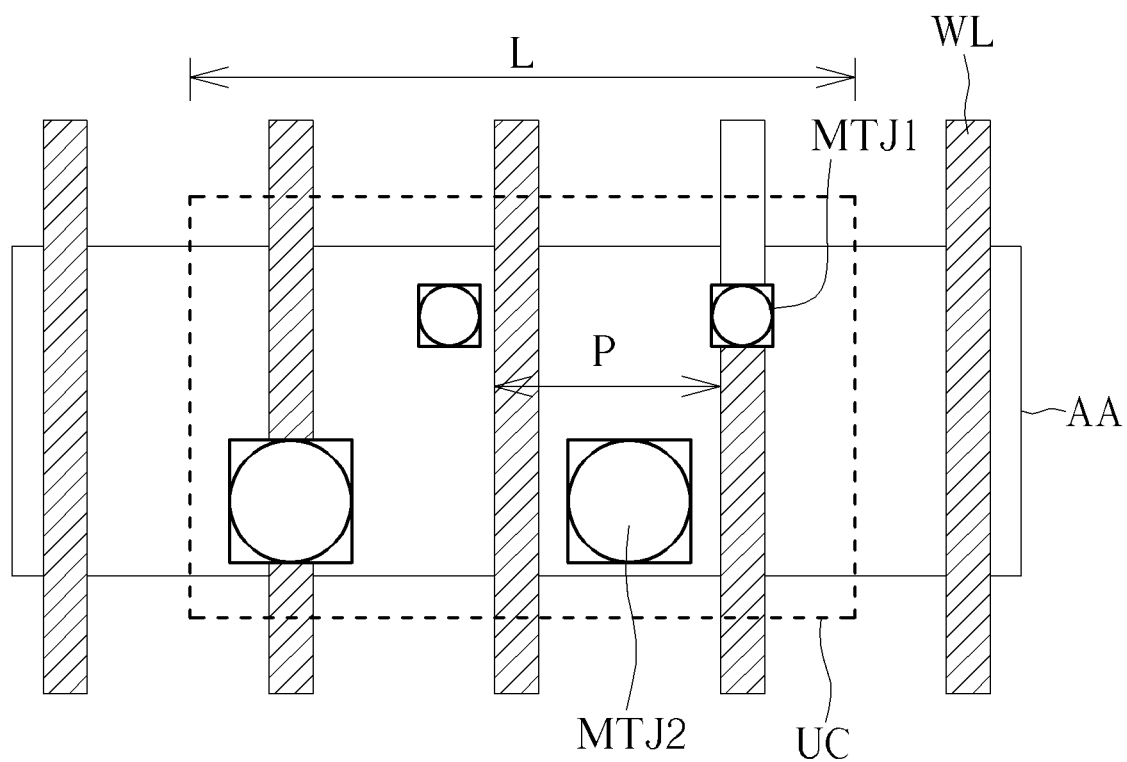
FIG. 4 is a schematic layout of 3T4M STT-MRAM in accordance with the embodiment of present invention.

Next, please refer concurrently to FIG. 4, which is a schematic layout of 3T4M STT-MRAM in accordance with the preferred embodiment of present invention. In the embodiment of present invention, each unit cell UC includes three word lines WL and fourth MTJs, wherein each larger MTJ2 is connected in series with a smaller MTJ1 to form a MTJ pair. As shown in the figure, the length L of every unit cell UC is three times the pitch P (i.e. gate pitch) of the word lines. Therefore, every MTJ in the unit cell will require a layout length of 0.75P (¾P) in average. In comparison to conventional STT-MRAM in 1T2M or 2T2M architectures that the MTJ requires a layout length of 1P, the design of present invention substantially reduces the required layout area for every unit cell UC.

Figure 5:
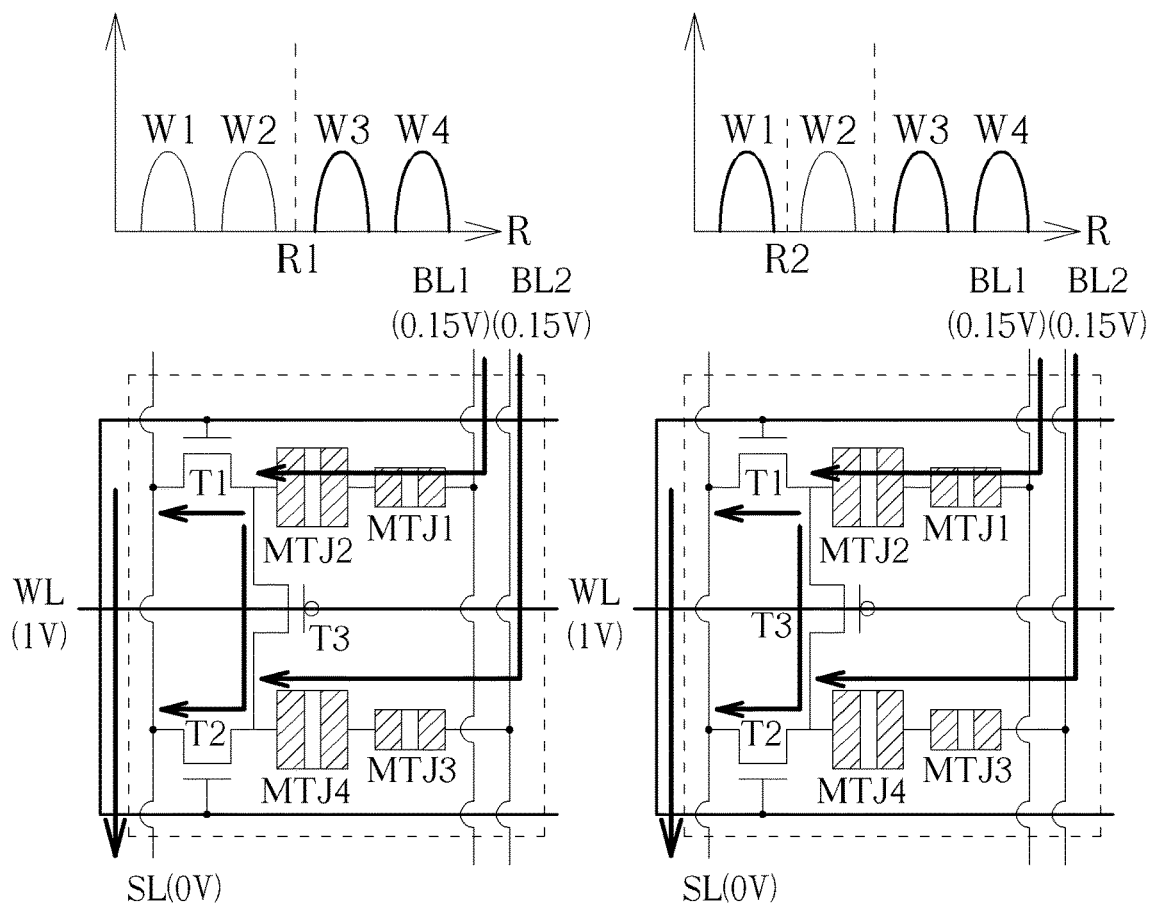
FIG. 5 is a schematic circuit diagram of 3T4M STT-MRAM in reading operation in accordance with the embodiment of present invention.

Next, please refer concurrently to FIG. 5, which is a schematic circuit diagram of 3T4M STT-MRAM in reading operation in accordance with the embodiment of present invention, wherein the horizontal axis represents resistance and the vertical axis represents the distribution of measured resistances. In the reading operation of STT-MRAM, the state of a MRAM is determined by measuring the resistances of included MTJs. With respect to the STT-MRAM in dual-bits architecture, since every two MTJs are connected in series to form a MTJ pair, the MRAM may include four states in the combination of RL/RL, RH/RL, RL/RH and RH/RH. Accordingly, in actual measurement, the measured resistances may be divided into four distribution sections W1~W4 as shown in the figure, wherein W1 represents the two MTJs in series are both in low state (RL/RL), W2 represents the larger MTJ in the MTJ pair is in high state and the smaller MTJ in the MTJ pair is in low state (RH/RL), W3 represents the larger MTJ in the MTJ pair is in low state and the smaller MTJ in the MTJ pair is in high state (RL/RH), and W4 represents the two MTJs in series are both in high state (RH/RH).

In the embodiment of present invention, every reading action would need two reading steps to determine the states of four MTJs in every unit cell. In first reading step, as shown in the left half of the figure, the state of a MTJ pair is first determined with reference to the middle value R1 of the distribution sections W1~W4. For example, when the measured resistance is greater than R1, it represent the MTJ pair is in high state, and when the measured resistance is lesser than R1, it represent the MTJ pair is in low state. However, performing the aforementioned step can merely determine the common state of the MTJ pair, and it can't distinguish the individual states of the included two MTJs. Therefore, it is necessary to perform a second reading step to determine the individual states for the two MTJs. Take the MTJ pair is determined in a low common state in the first reading step as an example, as shown in the right half of the figure, the state of the two MTJs may be determined in the second reading step with reference to the middle value R2 of the two low-state distribution sections W1, W2. For example, when the measured resistance is greater than R2, it represent the state of MTJ pair is in the distribution section W2 (i.e. RH/RL), and when the measured resistance is lesser than R2, it represent the state of MTJ pair is in the distribution section W1 (i.e. RL/RL). Accordingly, the individual states of four MTJs in every unit cell UC may be determined through the aforementioned two-step reading operation.

Refer still to FIG. 5. In every reading step, the three transistors T1~T3 in every unit cell are opened individually through word lines WL (1V), and a voltage (0.15V) is applied on the bit lines BL1, BL2 to generate currents flowing to the common source line SL (0V) respectively through the first MTJ pair (MTJ1/MTJ2) and the second MTJ pair (MTJ3/MTJ4). The difference between the two reading steps lies in the different reference levels R1, R2 adopted in the steps. The advantage of aforementioned reading operation of the present invention is that the two reading steps can read the individual states of four MTJs since two bit lines are used simultaneously in the steps to apply voltage for measurement. In comparison to conventional 1T2M or 2T2M STT-MRAM architecture that two reading steps can only read individual states for one or two MTJs, the design of present invention double the reading speed. Furthermore, since the MRAM of present invention adopts the architecture of three transistors connected in series, greater reading current required in the operation may further increase the reading speed. In addition, the generated current would flow through the three transistors, and this may help to prevent the resistance variations between the transistors that may affect the measurement results.

Figure 6:
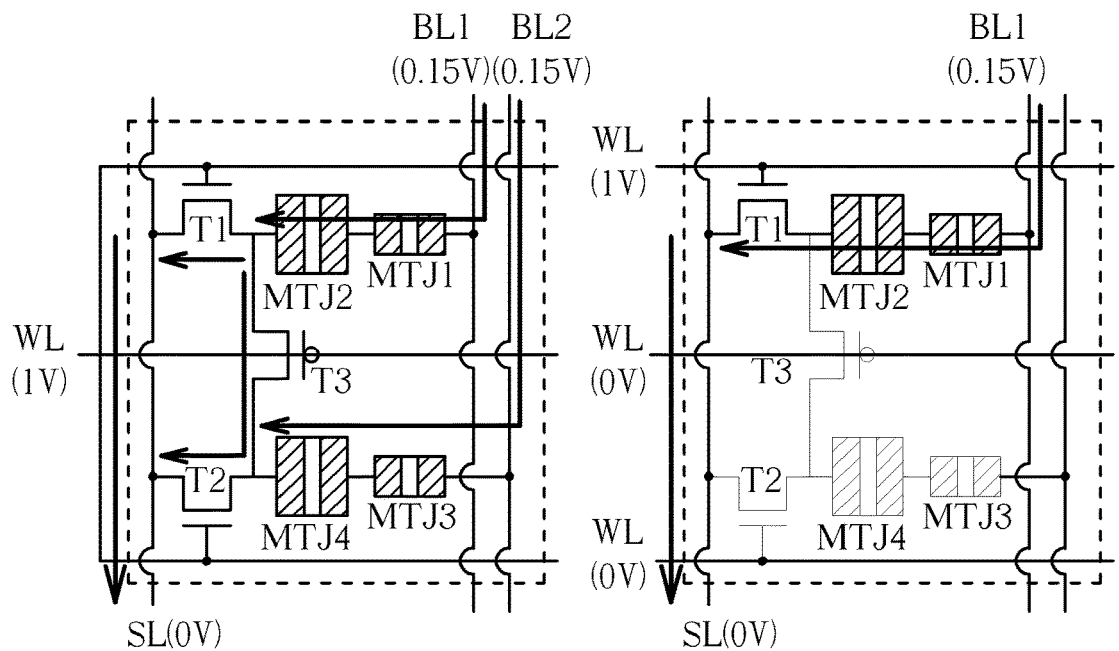
FIG. 6 is a schematic circuit diagram of 3T4M STT-MRAM in high performance reading mode and in low power reading mode in accordance with the embodiment of present invention.

Next, please refer to FIG. 6, which is a schematic circuit diagram of 3T4M STT-MRAM in high performance reading mode and in low power reading mode in accordance with the preferred embodiment of present invention. Another advantage of the present invention is that it can adopt two operation modes of high performance reading mode and low power reading mode. In the case that batteries have sufficient power, system may operate the MRAM in high performance reading mode. As shown in the left half of FIG. 6, in this operational mode, the three word lines in the unit cell may be connected to a common word line WL and be applied with a voltage (1V) to open the three transistors T1~T3.

Since all of the three transistors T1~T3 are opened, the bit lines BL1, BL2 may both be applied with a voltage (0.15V) to generate currents flowing respectively through the two MTJ pairs (MTJ1/MTJ2 and MTJ3/MTJ4) to measure their individual resistances. Since it requires simultaneous driving of the three word lines and the two bit lines, it is suggested to operate this mode in sufficient battery capacity.

On the other hand, refer still to FIG. 6. In low power consumption mode, as shown in the right half of FIG. 6, only one of the three word lines in the unit cell will be applied the voltage (1V) to open the corresponding first transistor T1 or second transistor T2. Since only one transistor (ex. the transistor T1) is opened, one of the bit lines BL1 maybe applied with a voltage (0.15V) to generate current flowing through the corresponding MTJ pair (MTJ1/MIJ2) and measure its individual resistances, while the other bit line BL2 is in floating state (0V). Since only one word line and one bit line are required to be driven in this mode, its power consumption is substantially lower, suitable for operating in insufficient battery capacity.

Figure 7:
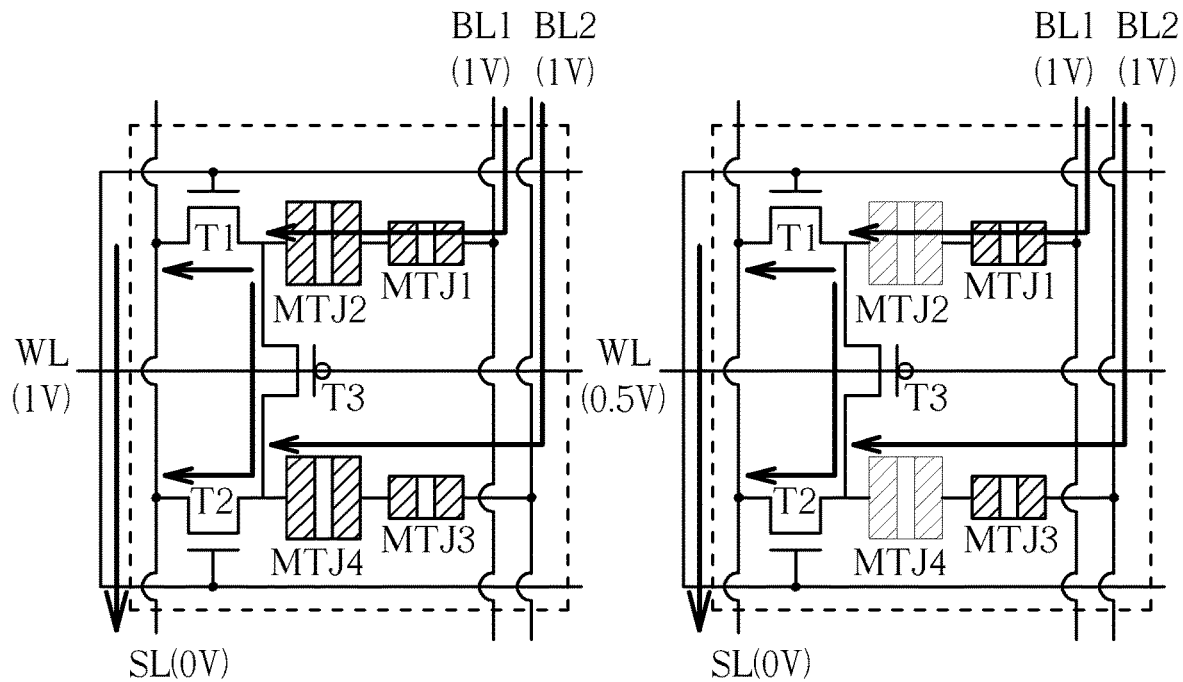
FIG. 7 is a schematic circuit diagram of 3T4M STT-MRAM in symmetrical writing operation in accordance with the embodiment of present invention.

Next, please refer to FIG. 7, which is a schematic circuit diagram of 3T4M STT-MRAM in symmetrical writing operation in accordance with the preferred embodiment of present invention. With respect to the STT-MRAM in dual-bits architecture, since every two MTJs (ex. MTJ1/MTJ2) are connected in series to form a MTJ pair, it also requires two writing steps in the writing operation, wherein one step is to perform the writing action for both of the two MTJs in the MTJ pair, while the other step is to flip one of the MTJs in the pair, so that the two MTJs connected in series may have individual states. As show in the left half of FIG. 7, in the first writing step, the common word line WL is applied with a voltage (1V) to completely open the three transistors T1~T3. Currents flow from the bit lines BL1, BL2 applied with the voltage (1V) to the common source line SL (0V) through the first MTJ pair (MTJ1/MTJ2) and the second MTJ pair (MTJ3/MTJ4) respectively, and these currents are greater than the individual currents inherently in the MTJs so as to accomplish the writing step for the four MTJs. After the first writing step is completed, as shown in the right half of FIG. 7, the common word line WL in second writing step is applied merely with a voltage of 0.5V, and this lesser voltage can only render the three transistors T1~T3 in half-opened state, i.e. the current flowing through the MTJ pair will be decreased. These lesser currents are configured to be greater than the inherent current of smaller MTJ (ex. MTJ1) but lesser than the inherent current of larger MTJ (ex. MTJ2). Therefore, only the MTJ2 in the MTJ pair is flipped back to the state before the writing in this step, while the MTJ1 remains in current state after writing. Accordingly, the four MTJs in every unit cell may be written into individual states through the aforementioned two writing steps.

Figure 8:
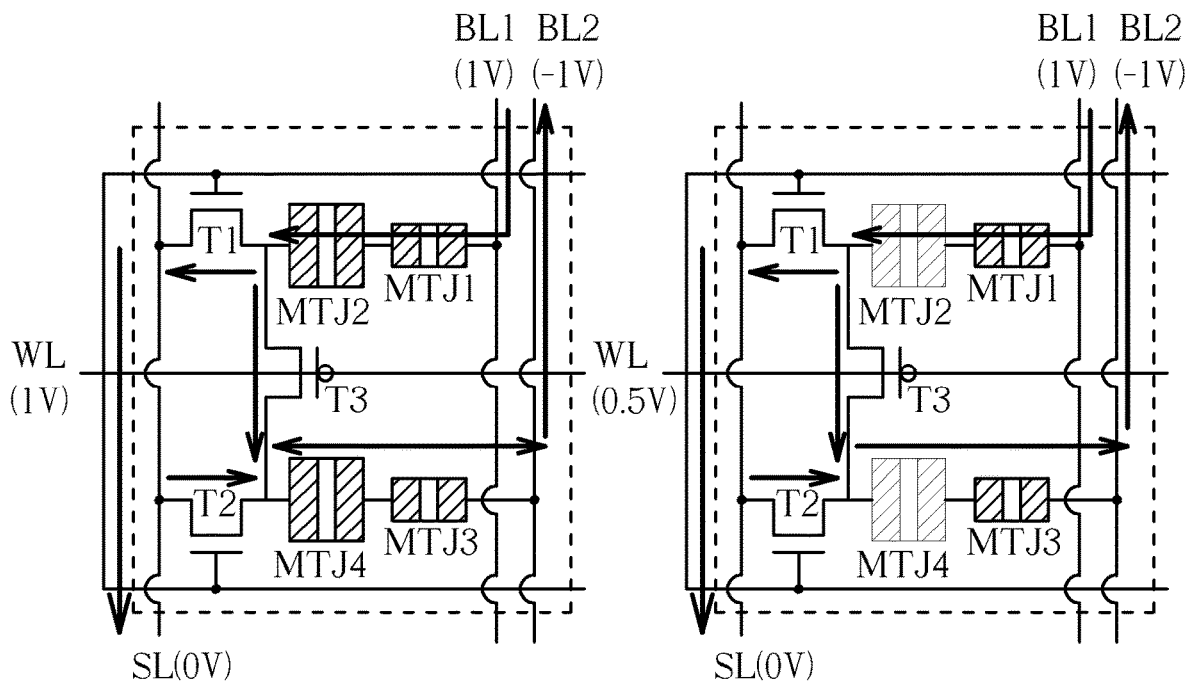
FIG. 8 is a schematic circuit diagram of 3T4M STT-MRAM in complementary writing operation in accordance with the embodiment of present invention.

Next, please refer to FIG. 8, which is a schematic circuit diagram of 3T4M STT-MRAM in complementary writing operation in accordance with the preferred embodiment of present invention. In certain cases, we hope the writing current can flows from the common source line to the bit line in order to achieve better current configuration. With respect to this purpose, the supply voltage for the two bit lines in every unit cell UC may be configured at 1V and −1V respectively and the supply voltage for the source line may be configured at 0V (a middle value between the range of 1V and −1V). In such a configuration, it can be seen from the figure that, on one hand, the current flows from the bit line BL1 applied with the voltage (1V) to the common source line (0V) through the first MTJ pair (MTJ1/MTJ2), while on the other hand, the current also flows from the common source line (0V) to the bit line BL2 (−1V) through the second MTJ pair (MTJ3/MTJ4), thereby accomplishing the complementary writing mechanism. The writing action in this embodiment is similar to the embodiment in FIG. 7, wherein the common word line WL is applied with different voltages (1V and 0.5V) in the two writing steps to achieve the effect of writing individual MTJs into specific states.

Figure 9:
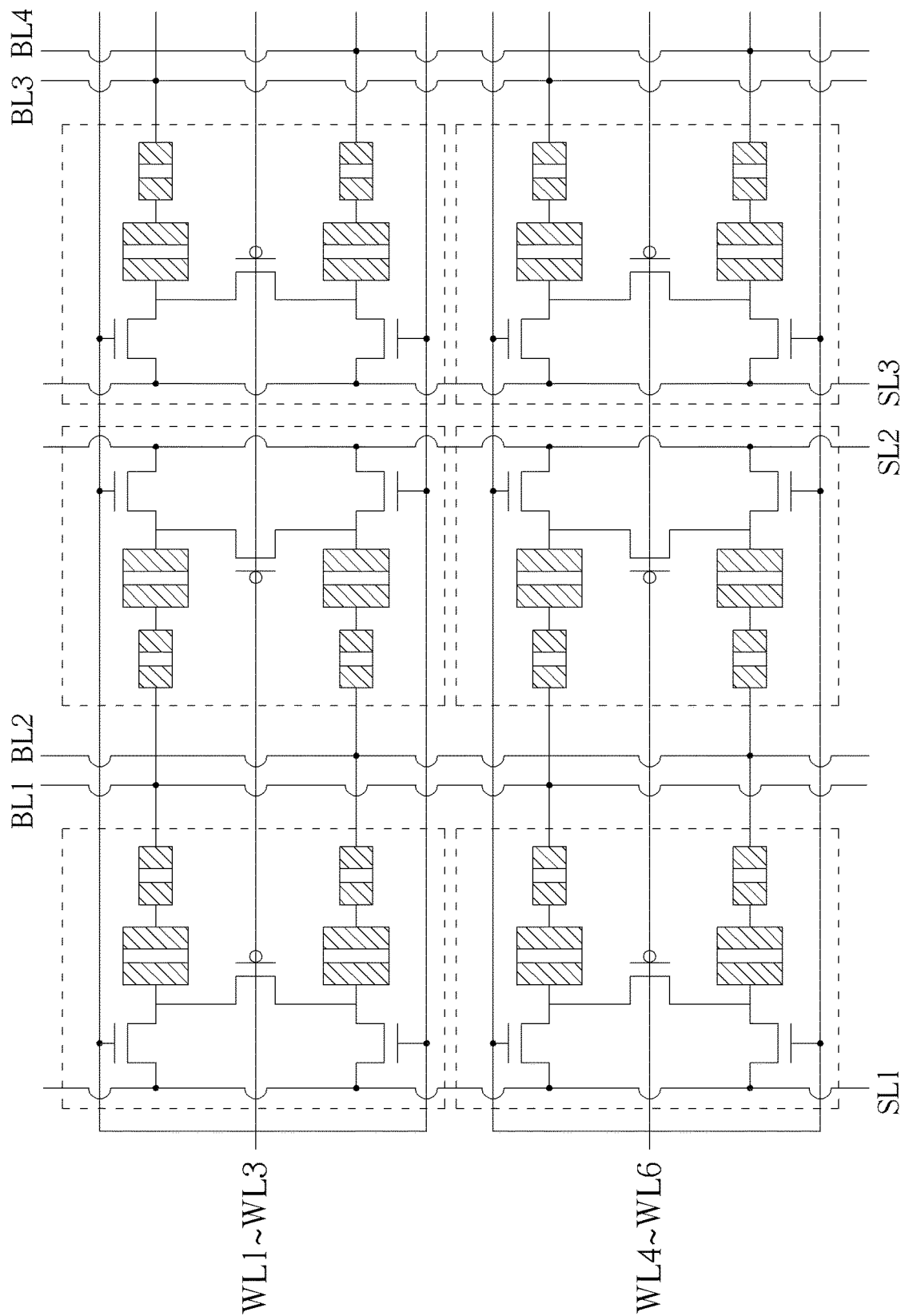
FIG. 9 is a schematic circuit diagram of a 24-bits memory array consisted of six unit cells in accordance with the embodiment of present invention.

Lastly, please refer to FIG. 9, which is a schematic circuit diagram of a 24-bits memory array consisted of six unit cells in accordance with the preferred embodiment of present invention. This memory array is in an arrangement of 2×3 unit cells, wherein the three unit cells in upper row share word lines WL1~WL3, while the three unit cells in lower row share word lines WL4~WL6. Furthermore, the bit lines BL1, BL2 may be shared by the unit cells at two sides to substantially reduce the bit lines required in the operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MRAM circuit structure with multiple unit cells, wherein each said unit cell comprises:
    three transistors, comprising a first transistor, a third transistor and a second transistor connected in series, wherein a junction of said first transistor and said third transistor is first node, and a junction of said second transistor and said third transistor is second node, and the other ends of said first transistor and said second transistor are connected to a common source line; and
    four MTJs, comprising a first MTJ, a second MTJ, a third MTJ and a fourth MTJ, wherein said first MTJ and said second MTJ are connected in series to form a first MTJ pair, and one end of said first MTJ pair is connected to said first node, and said third MTJ and said fourth MTJ are connected in series to form a second MTJ pair, and one end of said second MTJ pair is connected to said second node, and said first MTJ and said second MTJ in said first MTJ pair are respectively a smaller MTJ and a larger MTJ, and said third MTJ and said fourth MTJ in said second MTJ pair are respectively a smaller MTJ and a larger MTJ.

2. The MRAM circuit structure of claim 1, wherein the other end of said first MTJ pair is connected to a first bit line, and the other end of said second MTJ pair is connected to a second bit line.

3. The MRAM circuit structure of claim 2, wherein said first bit line and said second bit line are shared by said unit cells at two sides of said first bit line and said second bit line.

4. The MRAM circuit structure of claim 2, wherein a voltage of said first bit line and a voltage of said second bit line are both greater than a voltage of said source line in symmetrical writing mode.

5. The MRAM circuit structure of claim 2, wherein a voltage of said source line is between a voltage of said first bit line and a voltage of said second bit line in complementary writing mode.

6. The MRAM circuit structure of claim 1, wherein said first transistor, said second transistor and said third transistor are connected respectively to a first word line, a second word line and a third word line.

7. The MRAM circuit structure of claim 6, wherein said first word line, said second word line and said third word line are further connected to a common word line.

8. The MRAM circuit structure of claim 1, wherein said first transistor, said second transistor and said third transistor are all opened in high performance mode so that both of said first MTJ pair and said second MTJ pair can be read or written.

9. The MRAM circuit structure of claim 1, wherein only one of said first transistor and said third transistor is opened in power saving mode so that only one of said first MTJ pair and said second MTJ pair can be read or written.

* * * * *